United States Patent
Jung et al.

(10) Patent No.: US 9,425,428 B2
(45) Date of Patent: Aug. 23, 2016

(54) ORGANIC LIGHT EMITTING DIODE DISPLAY DEVICE AND METHOD OF MANUFACTURING THE SAME

(71) Applicant: LG DISPLAY CO., LTD., Seoul (KR)

(72) Inventors: SangChul Jung, Paju-Si (KR); MinJu Kim, Paju-Si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/504,119

(22) Filed: Oct. 1, 2014

(65) Prior Publication Data

US 2015/0090995 A1    Apr. 2, 2015

(30) Foreign Application Priority Data

Oct. 1, 2013  (KR) .......................... 10-2013-0117537

(51) Int. Cl.
*H01L 51/52*    (2006.01)

(52) U.S. Cl.
CPC .................................. *H01L 51/5253* (2013.01)

(58) Field of Classification Search
CPC .. H01L 27/3244; H01L 51/5253; H01L 51/56
See application file for complete search history.

(56) References Cited

U.S. PATENT DOCUMENTS

| | | | |
|---|---|---|---|
| 6,864,629 B2* | 3/2005 | Miyaguchi | H01L 51/5253 313/512 |
| 8,053,984 B2* | 11/2011 | Lee | H01L 51/5256 313/504 |
| 2008/0124917 A1* | 5/2008 | Oh | H01L 21/76885 438/637 |

* cited by examiner

*Primary Examiner* — David Vu
(74) *Attorney, Agent, or Firm* — Birch, Stewart, Kolasch & Birch, LLP

(57) ABSTRACT

Discussed are an organic light emitting diode (OLED) display device and a method of manufacturing the same, which can simplify a manufacturing process and decrease an error. The OLED display device includes a substrate on which an organic light emitting diode (OLED) is formed, a first inorganic thin layer configured to cover the OLED, an organic deposition layer configured to have an organic layer characteristic covering the first inorganic thin layer, and a second inorganic thin layer configured to cover the organic deposition layer.

18 Claims, 3 Drawing Sheets

ORGANIC LIGHT EMITTING DIODE DISPLAY DEVICE AND METHOD OF MANUFACTURING THE SAME

CROSS-REFERENCE TO RELATED APPLICATION

Pursuant to 35 U.S.C. §119(a), this application claims the benefit of earlier filing date and right of priority to Korean Application No. 10-2013-0117537, filed on Oct. 1, 2013, the contents of which is incorporated by reference herein in its entirety.

BACKGROUND OF THE DISCLOSURE

1. Field of the Disclosure

The present disclosure relates to an organic light emitting diode (OLED) display device, and particularly, to an OLED display device and a method of manufacturing the same, which can simplify a manufacturing process and decrease an error.

2. Background of the Disclosure

OLED display devices, which control an amount of light emitted from an organic emission layer to display an image, are attracting much attention as flat panel display devices for reducing weight and volume which are drawbacks of cathode ray tubes (CRTs).

OLED display devices have a structure in which a sub-pixel driver array and an organic emission array are formed on a substrate, and an image is displayed by light emitted from an OLED of the organic emission array. The OLED display devices use a self-emitting element including a thin emission layer formed between electrodes, and thus can be thinned like papers.

The OLED is deteriorated by an internal cause, and for example, an electrode and an emission layer are deteriorated by oxygen, and deterioration is made by a reaction between the emission layer and an interface. Also, the OLED is easily deteriorated by external causes such as external moisture, oxygen, ultraviolet light, and a manufacturing condition of a device. Therefore, packaging of the OLED is important.

In the related art, a method of packaging an OLED uses a method which seals a substrate, on which an OLED is formed, with a protective cap. However, since the method should use a separate material such as an adhesive or a moisture absorbent, the material cost increases. Also, since the protective cap is formed, a volume and a thickness of an OLED display device increase. Also, since a material of the protective cap is glass, it is difficult to realize a flexibility of the OLED display device.

To address such problems, a method which encapsulates an OLED by using a plurality of thin layers is attempted.

FIG. 1 is a schematic cross-sectional view of a related art OLED display device, and FIG. 2 is a flowchart illustrating a process for the related art OLED display device.

Referring to FIGS. 1 and 2, a related art OLED display device 1 includes an OLED 11, which is formed on a substrate 10, and an encapsulating layer which is formed by stacking a plurality of thin layers, namely, a first inorganic layer 12, an organic layer 13, and a second inorganic layer, 14 to cover the OLED 11.

The kind of the substrate 10 is not limited, and for example, the substrate 10 may use a glass substrate, a plastic substrate, or a silicon substrate.

Moreover, each of the first inorganic layer 12 and the second inorganic layer 14 uses one or a combination of two or more of silicon nitride, silicon oxide, metal, and metal oxide.

Moreover, the organic layer 13 uses a polymer, which uses acrylate and an imide-based polymer.

The OLED 11 is formed in a display area of the substrate 10, and although not shown, an organic emission layer (not shown) is formed between a first electrode (not shown) and a second electrode (not shown) in operation S10.

The substrate 10, on which the OLED 11 is formed, is moved a separate chamber (not shown) for an inorganic layer manufacturing process. In operation S20, the first inorganic layer 12 is formed to cover the OLED 11 by performing processes such as chemical vapor deposition (CVD), plasma enhanced chemical vapor deposition (PECVD), thermal deposition, sputtering deposition, ion beam deposition, electron beam deposition, and atomic layer deposition.

Subsequently, the substrate 10 on which the first inorganic layer 12 is formed is moved a separate chamber (not shown) for an organic layer manufacturing process. In operation S30, the organic layer 13 is formed to cover the OLED 11 by performing processes such as screen printing, slot printing, and inkjet.

Subsequently, the substrate 10 on which the inorganic layer 13 is formed is again moved the separate chamber (not shown) for the inorganic layer manufacturing process. In operation S40, the second inorganic layer 14 is formed to cover the organic layer 13 by performing the CVD process or the PECVD process once again, and thus, the OLED 11 is encapsulated.

However, in the above-described process of manufacturing the related art OLED display device, since a process of forming the inorganic layer differs from a process of forming the organic layer, additional process equipment (for example, printing process equipment) is further needed. For this reason, in the related art OLED display device 1, a manufacturing process is complicated, causing an increase in cost.

Furthermore, in a printing process of the organic layer 13, a nozzle is blocked, and an undoped case occurs. For this reason, a foreign material 15 occurs in the organic layer 13. Alternatively, due to a stress characteristic difference between different layers (i.e., the organic layer and the inorganic layer), a layer-crumpled phenomenon or a pinhole occurs at a boundary between the different layers.

SUMMARY OF THE DISCLOSURE

Therefore, an aspect of the detailed description is to provide an OLED display device and a method of manufacturing the same, which can simplify a manufacturing process and decrease an error.

To achieve these and other advantages and in accordance with the purpose of this specification, as embodied and broadly described herein, an organic light emitting diode (OLED) display device includes: a substrate on which an organic light emitting diode (OLED) is formed; a first inorganic thin layer configured to cover the OLED; an organic deposition layer configured to have an organic layer characteristic covering the first inorganic thin layer; and a second inorganic thin layer configured to cover the organic deposition layer.

In another aspect of the present invention, a method of manufacturing an organic light emitting diode (OLED) display device includes: forming an organic light emitting diode (OLED) on a substrate; forming a first inorganic thin layer to cover the OLED; forming an organic deposition layer having an organic layer characteristic to cover the first inorganic thin layer; and forming a second inorganic thin layer to cover the organic deposition layer, wherein the first inorganic thin layer, the organic deposition layer, and the second inorganic thin layer are formed by the same process.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, an OLED display device and a method of manufacturing the same according to embodiments of the present invention will be described in detail with reference to the accompanying drawings.

Figure 1:
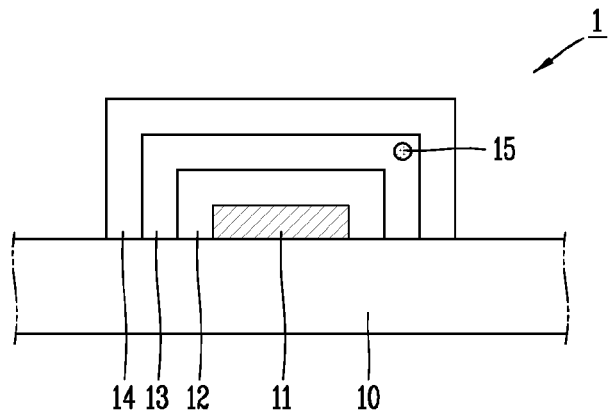
FIG. 1 is a schematic cross-sectional view of a related art OLED display device.
Figure 2:
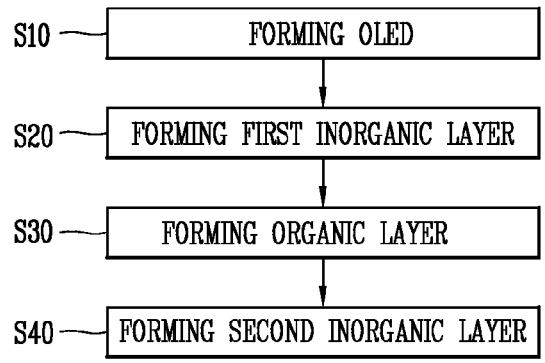
FIG. 2 is a flowchart illustrating a process for the related art OLED display device.
Figure 3:
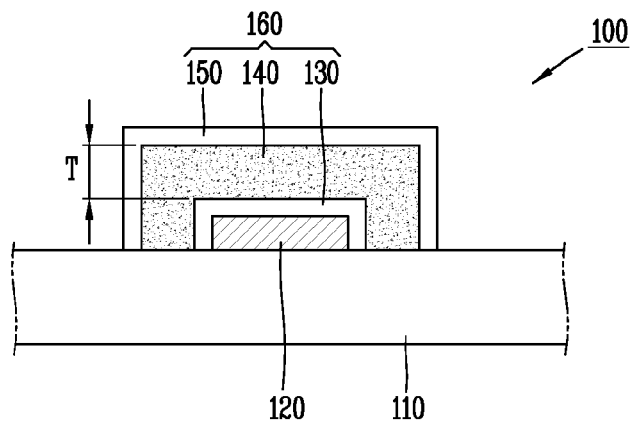
FIG. 3 is a schematic cross-sectional view of an OLED display device according to an embodiment of the present invention.

FIG. 3 is a schematic cross-sectional view of an OLED display device according to an embodiment of the present invention.

Referring to FIG. 3, an OLED display device 100 according to an embodiment of the present invention may include an OLED 120, which is formed on a substrate 110, and an encapsulating layer 160 which is formed of a plurality of thin layers 130, 140 and 150 and encapsulates the OLED 120. All the components of the device 100 are operatively coupled and configured.

The substrate 110 may use a transparent substrate which is formed of glass, plastic, or a conductive material.

A buffer layer (not shown) for protecting the OLED 120 may be further formed on the substrate 110. The buffer layer may be formed of SiO2 or SiNx.

The OLED 120 is driven by a cell driving array (not shown) which is formed on the substrate 110, and the cell driving array may be configured with a plurality of sub-pixel drivers.

Each of the plurality of sub-pixel drivers may include a plurality of signal lines which include a gate line and a data line, a transistor, a capacitor, and a plurality of insulating layers. The transistor may include a switching transistor and a driving transistor.

Here, the switching transistor may transfer a data signal, which is applied from the data line, to the driving transistor in response to a gate signal applied from the gate line. Also, the driving transistor may control an amount of current flowing in the OLED 120, in response to the data signal supplied from the switching transistor. Also, even when the switching transistor is turned off, the capacitor may allow a constant current to flow in the OLED 120 through the driving transistor.

The OLED 120 may emit red light, green light, and blue light according to a flow of a current supplied from the sub-pixel driver, thereby displaying image information. The OLED 120 may be driven in an active matrix type or a passive matrix type.

The OLED 120 may include a first electrode connected to the driving transistor, a second electrode which is an electrode opposite to the first electrode, and an organic emission layer which is disposed therebetween and emits light.

Here, the first electrode may be an anode electrode, and the second electrode may be a cathode electrode. The first electrode may be insulated from the second electrode. The first electrode and the second electrode may apply voltages having different polarities to the organic emission layer, and thus allow light to be emitted from the organic emission layer.

When the OLED display device 100 according to an embodiment of the present invention is manufactured in a bottom emission type, the first electrode may be formed of a transparent conductive layer. The transparent conductive layer may be formed of indium tin oxide (ITO), tin oxide (TO), indium zinc oxide (IZO), indium tin zinc oxide (ITZO), or a combination thereof. The second electrode may be formed all over the substrate 110, and may be formed of metal materials such as chromium (Cr), aluminum (Al), and molybdenum (Mo), an alloy thereof, or oxide. The second electrode may be formed of multi layers including two or more layers.

Moreover, when the OLED display device 100 is manufactured in a top emission type, the first electrode may be formed of metal materials such as Cr, Al, and Mo, an alloy thereof, or oxide, and may be formed of multi layers including two or more layers. The second electrode may be formed of a transparent conductive layer such as ITO or IZO.

The organic emission layer is a layer in which a positive hole and an electron respectively injected from the first electrode and the second electrode are combined to emit light. The organic emission layer may include a hole injection layer (HIL), a hole transporting layer (HTL), an emission layer (EML), an electron transporting layer (ETL), and an electron injection layer (EIL).

The OLED 120 may be divided in units of a pixel unit by an insulating layer such as a bank (not shown), and may display an image by using the principle that light emitted from the organic emission layer is output to the outside through a transparent substrate or a transparent electrode.

The OLED 120 is vulnerable to external moisture or oxygen, and thus, an encapsulating layer 160 for protecting the OLED 120 may be formed on the OLED 120.

The encapsulating layer 160 may be configured with one or more thin layers which are stacked on the OLED 120. In the present embodiment, a case in which a first thin layer 30, a second thin layer 140, and a third thin layer 150 are stacked to form the encapsulating layer 160 will be described as an example. The encapsulating layer 160 may be formed on the OLED 120 to have a thickness of about 1 μm to about 10 μm.

The first thin layer 130 of the encapsulating layer 160 is an inorganic layer, and may be formed just on the OLED 120 to cover the OLED 120. The first thin layer 130 may be formed of multi layers formed of one or a combination of two or more of silicon nitride, silicon oxide, metal, and metal oxide such as $Al_2O_3$, AlON, MgO, ZnO, $HfO_2$, $ZrO_2$. The first thin layer 130 may be formed on the OLED 120 to a thickness of about 0.1 μm to about 1 μm by a CVD process or a PECVD process.

The second thin layer 140 may be formed on the first thin layer 130 to cover the first thin layer 130. The second thin layer 140 may be an organic deposition layer such as a SiOC layer including carbon or a SiOCH layer including carbon or oxygen. The second thin layer 140 has a characteristic of an organic layer, and thus has a good covering characteristic to the first thin layer 130 or the OLED 120.

The second thin layer 140 may be formed by the same process as the above-described process of the first thin layer 130, namely, the CVD process or the PECVD process. The second thin layer 140 may be formed on the first thin layer 130 to have a thickness T of 1 μm to 10 μm.

The third thin layer 150 is an inorganic thin layer which is the same as the first thin layer 130. The third thin layer 150 may be formed by the same process as the above-described process of the first thin layer 130, namely, the CVD process or the PECVD process, to cover the second thin layer 140. The third thin layer 150 may be formed on the second thin layer 140 to have a thickness T of 0.1 μm to 1 μm.

As described above, the encapsulating layer 160 is formed by the plurality of thin layers (i.e., the first thin layer 130, the second thin layer 140, and the third layer 150) to cover the OLED 120 which is formed on the substrate 110, thereby preventing moisture or air from penetrating into the OLED 120 from the outside.

Hereinafter, a method of manufacturing an OLED display device according to an embodiment of the present invention will be described in detail.

Figure 4A:
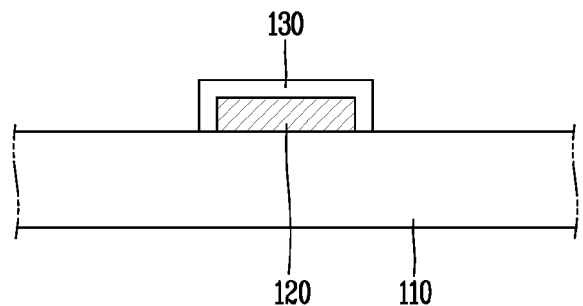
FIGS. 4A to 4C are process views of the OLED display device of FIG. 3.
Figure 4B:
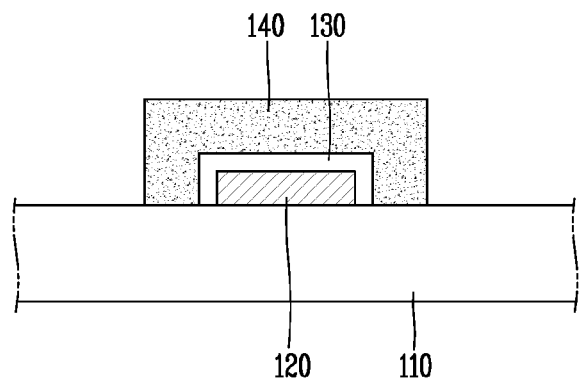
Figure 4C:
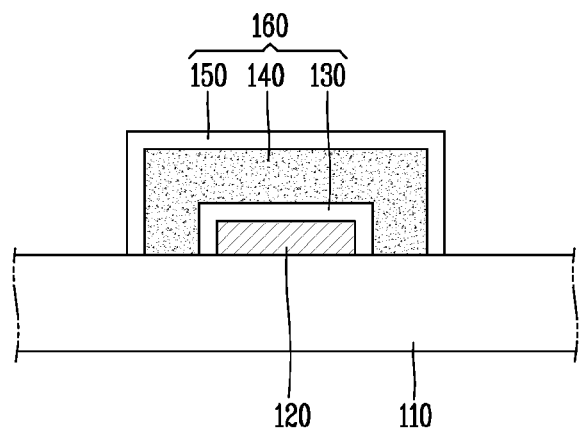

FIGS. 4A to 4C are process views of the OLED display device of FIG. 3.

Referring to FIG. 4A, the substrate 110 on which the OLED 120 is formed may be prepared, and then, the first thin layer 130 may be formed to cover the OLED 120.

The first thin layer 130 may be formed on the OLED 120 by a deposition process such as the CVD process or the PECVD process. The first thin layer 130 may be formed of multi layers formed of one or a combination of two or more of silicon nitride, silicon oxide, metal, and metal oxide such as $Al_2O_3$, AlON, MgO, ZnO, $HfO_2$, $ZrO_2$. The first thin layer 130 may be deposited and formed on the OLED 120 to a thickness of about 1 μm.

Moreover, although not shown, the buffer layer may be further formed between the substrate 110 and the OLED 120. Also, a passivation layer (not shown) may be further formed on the second electrode of the OLED 120 to sufficiently cover the second electrode.

Referring to FIG. 4B, the second thin layer 140 may be formed to cover the first thin layer 130.

The second thin layer 140 may be formed by the same process as the process of the first thin layer 130, namely, the CVD process or the PECVD process. The second thin layer 140 may be formed by causing a chemical reaction of a polymer monomer through the CVD process or the PECVD process.

Here, the polymer monomer may use Hexamethyldisiloxane (HMDSO), Tetramethyldisiloxane (TMDSO), TMMOS $(CH_3)_3SiOCH_3$, Bistrimetylsilylmethane (BTMSM), Tetraethoxysilane (TEOS), DVTMDSO[$(CH_3)_2$ViSi-0-SiVi $(CH_3)_2$], or Octamethylcyclotetrasiloxan (OMCATS). Also, oxygen ($O_2$) or hydrogen ($H_2$) may be used as a medium for the chemical reaction of the polymer monomer.

For example, when HMDSO is used as the polymer monomer, a SiOC layer is formed by reacting HMDSO as expressed in the following chemical reaction formula, and the second thin layer 140 may be formed by depositing the SiOC layer on the first thin layer 130.

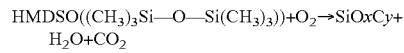

[Formula]

Here, in a process condition for forming the second thin layer 140, a temperature of a chamber (or a stage) may be a room temperature to 100 degrees C., a pressure of the chamber may be 0.4 Torr to 1.6 Torr, and a flow rate of O2 may be 100 sccm to 1,000 sccm.

Moreover, a deposition rate (D/R) of the second thin layer 140 may be 20,000 Å/min or more. About 0.5 minutes to 2.5 minutes may be expended when the second thin layer 140 is formed on the first thin layer 130 to have about 1 μm to about 10 μm.

Subsequently, the deposited second thin layer 140 may be cured. This is for preventing an error, such as a layer being crumpled, from occurring at a boundary between two layers due to a hardness difference between the second thin layer 140 and the below-described third thin layer 150. The second thin layer 140 may be cured for about 10 minutes to about 200 minutes under a temperature of about 30 degrees C. to about 100 degrees C.

Referring to FIG. 4C, the third thin layer 150 may be formed to cover the second thin layer 140.

Similarly to the above-described first thin layer 130, the third thin layer 150 may be formed by a deposition process such as the CVD process or the PECVD process. The third thin layer 150 may be formed of multi layers formed of one or a combination of two or more of silicon nitride, silicon oxide, metal, and metal oxide such as $Al_2O_3$, AlON, MgO, ZnO, $HfO_2$, $ZrO_2$.

As described above, in the OLED display device 100 according to an embodiment of the present invention, the plurality of thin layers of the encapsulating layer 160 covering the OLED 120 are all formed by a single process, namely, the CVD process or the PECVD process, and thus, a manufacturing process can be simplified and the manufacturing cost can be reduced in comparison with a related art OLED display device in which an inorganic layer and an organic layer are formed by different processes.

Figure 5:
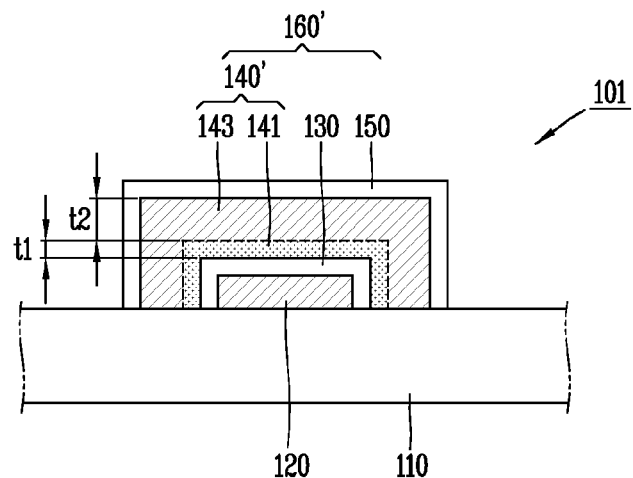
FIG. 5 is a schematic cross-sectional view of an OLED display device according to another embodiment of the present invention.

FIG. 5 is a schematic cross-sectional view of an OLED display device according to another embodiment of the present invention.

Except that a second thin layer 140' of an encapsulating layer 160' is formed of a double layer, an OLED display device 101 illustrated in FIG. 5 has the same configuration as that of the OLED display device 100 of FIG. 3. Therefore, like elements are referred to by like reference numbers refer to like elements, and thus, their detailed descriptions are not repeated.

Referring to FIG. 5, the OLED display device 101 according to another embodiment of the present invention may include an OLED 120, which is formed on a substrate 110, and the encapsulating layer 160' which is formed of a plurality of thin layers 130, 140' and 150 and encapsulates the OLED 120.

The OLED 120 may include a first electrode, a second electrode which is an electrode opposite to the first electrode, and an organic emission layer which is disposed therebetween and emits light.

The encapsulating layer 160' may be formed to cover the OLED 120, and prevents moisture or oxygen from penetrating into the OLED 120 from the outside.

The encapsulating layer 160' may include a first thin layer 130, a second thin layer 140', a third thin layer 150 which are stacked on the OLED 120. Here, each the first thin layer 130 and the third thin layer 150 is an inorganic thin layer, and the second thin layer 140' therebetween may be an organic deposition layer having a characteristic of an organic layer.

In the OLED display device 101 according to the present embodiment, the second thin layer 140' of the encapsulating layer 160' may have a multi-layer structure. For example, the second thin layer 140' may have a double-layer structure which includes a first layer 141 on the first thin layer 130 and a second layer 143 on the first layer 141.

Here, the first layer 141 of the second thin layer 140' may be a flexible organic layer which has a good covering characteristic to the first thin layer 130 or the OLED 120, and the second layer 143 may be a non-flexible organic layer which has a high hardness characteristic for decreasing a hardness difference with the third thin layer 150. The first layer 141 and second layer 143 of the second thin layer 140' may be successively formed in a process of forming the second thin layer 140'.

In other words, as described above, the second thin layer 140' may be formed by causing a chemical reaction of a polymer monomer through the CVD process or the PECVD process. In this case, the first layer 141 and second layer 143 of the second thin layer 140' may be formed to have different characteristics by adjusting a process condition, for example, a temperature, a pressure, or a flow rate of O2.

Here, the first layer 141 of the second thin layer 140' may be formed to have a higher content of carbon than that of the second layer 143. A content of carbon of the first layer 141 is about 30% to about 50%, and a content of carbon of the second layer 143 is about 0% to about 30%.

Moreover, the second thin layer 140' may be formed on the first thin layer 130 to have a thickness of about 1 μm to about 10 μm. In this case, the first layer 141 of the second thin layer 140' may be formed to a thickness t1 which is equal to or less than 70% of a total thickness of the second thin layer 140', and the second layer 143 may be formed to a thickness t2 which is equal to or greater than 30% of the total thickness of the second thin layer 140'. For example, when the total thickness of the second thin layer 140' is 5 μm, the thickness t1 of the first layer 141 may be about 1 μm to about 3.5 μm, and the thickness t2 of the second layer 143 may be about 1.5 μm to about 4 μm.

The first thin layer 130, the second thin layer 140', and the third layer 150 may all be formed by the CVD process or the PECVD process.

In the present embodiment, a case in which the second thin layer 140' is formed by stacking the first layer 141 (which is the flexible organic layer) and the second layer 143 (which is the non-flexible organic layer) has been described above as an example, and the present embodiment is not limited thereto. For example, the second thin layer 140' may have a triple-layer structure in which two non-flexible organic layers and a flexible organic layer therebetween are stacked, and may have a structure which is stacked in the order of a non-flexible organic layer and a flexible organic layer.

As described above, in the OLED display device according to the present embodiment, the encapsulating layer 160' is formed of a plurality of thin layers to cover the OLED 120 which is formed on the substrate 110, and an organic deposition layer between inorganic thin layers is formed in a double-layer structure having different characteristics.

Therefore, a covering characteristic of the OLED 120 is enhanced by the organic deposition layer, and due to a hardness difference with the inorganic thin layer, a layer-crumpled phenomenon can be prevented from occurring at a boundary.

Hereinafter, a method of manufacturing an OLED display device according to the present embodiment will be described in detail.

Figure 6A:
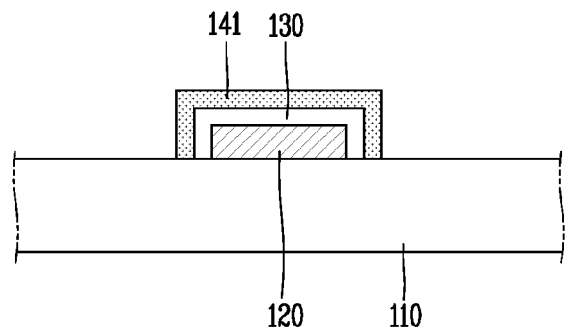
FIGS. 6A and 6B are process views of the OLED display device of FIG. 5.
Figure 6B:
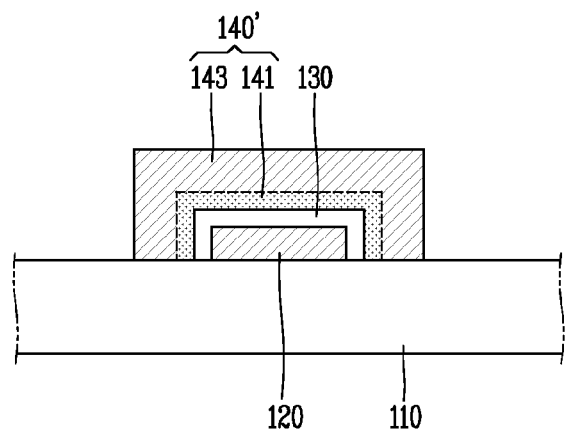

FIGS. 6A and 6B are process views of the OLED display device of FIG. 5.

First, as described above with reference to FIG. 4A, the substrate 110 on which the OLED 120 is formed may be prepared, and then, the first thin layer 130 may be formed to cover the OLED 120.

The first thin layer 130 may be formed on the OLED 120 by a deposition process such as the CVD process or the PECVD process. The first thin layer 130 may be formed of multi layers formed of one or a combination of two or more of silicon nitride, silicon oxide, metal, and metal oxide such as $Al_2O_3$, AlON, MgO, ZnO, $HfO_2$, $ZrO_2$. The first thin layer 130 may be deposited and formed on the OLED 120 to a thickness of about 1 μm.

Referring to FIGS. 6A and 6B, the second thin layer 140' is formed to cover the first thin layer 130, and the first layer 141 and second layer 143 of the second thin layer 140' may be formed by a successive process.

The second thin layer 140' may be formed by causing a chemical reaction of a polymer monomer through the CVD process or the PECVD process. The polymer monomer may use HMDSO, TMDSO, TMMOS($CH_3$)$_3$SiOCH$_3$, BTMSM, TEOS, DVTMDSO[($CH_3$)$_2$ViSi-0-SiVi($CH_3$)$_2$], or OMCATS. Also, in a process condition for forming the second thin layer 140', a temperature may be a room temperature to 100 degrees C., a pressure may be 0.4 Torr to 1.6 Torr, and a flow rate of O2 may be 100 sccm to 1,000 sccm.

The first layer 141 and second layer 143 of the second thin layer 140' may be successively formed by differently setting a process condition in the above-described chemical reaction of the polymer monomer.

In other words, in the first layer 141 of the second thin layer 140', a content of carbon may be set to 30% to 50% by adjusting at least one of a temperature, a pressure, and a flow rate of O2 in the above-described chemical reaction of the polymer monomer. Here, the first layer 141 of the second thin layer 140' may be deposited on the first thin layer 130 to about 1 μm to about 3.5 μm.

When deposition of the first layer 141 is completed, the second layer 143 in which a content of carbon is 0% to 30% may be formed by adjusting at least one of a temperature, a pressure, and a flow rate of O2 once again. Here, the second layer 143 of the second thin layer 140' may be deposited on the first layer 141 to about 1.5 μm to about 4 μm.

That is, in the present embodiment, the second thin layer 140' is successively formed in a double-layer structure, and thus, a process of curing the second thin layer 140 described above with reference to FIG. 4B may be omitted. Accordingly, a manufacturing process can be further simplified.

Moreover, a hardness of the second layer 143 of the second thin layer 140' increases due to a content of carbon, and thus, a layer-crumpled phenomenon can be prevented from occurring at a boundary between the second layer 143 and the third thin layer 150 contacting the second layer 143.

Here, the first layer 141 of the second thin layer 140' may be a flexible organic layer, and the second layer 143 may be a non-flexible organic layer. Also, the second thin layer 140' may have a triple-layer structure in which two non-flexible organic layers and a flexible organic layer therebetween are stacked, and may have a structure which is stacked in the order of a non-flexible organic layer and a flexible organic layer.

As described above, when the second thin layer 140' having a double-layer structure of the first layer 141 and the second layer 143 is formed, as described above with reference to FIG. 4C, the third thin layer 150 may be formed to cover the second thin layer 140'.

Similarly to the above-described first thin layer 130, the third thin layer 150 may be formed by the deposition process such as the CVD process or the PECVD process. The third thin layer 150 may be formed of multi layers formed of one or a combination of two or more of silicon nitride, silicon oxide, metal, and metal oxide such as $Al_2O_3$, AlON, MgO, ZnO, $HfO_2$, $ZrO_2$.

In the OLED display device and the method of manufacturing the same according to the embodiments of the present invention, the plurality of thin layers included in the encapsulating layer which protects the OLED are simultaneously formed by the same process, and thus, a process of manufacturing the OLED display device can be simplified, thereby reducing the manufacturing cost.

Moreover, an image quality and an appearance defect of the OLED display device can be reduced by removing a pinhole or a layer-crumpled phenomenon which occurs at a boundary between different layers of the encapsulating layer.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. An organic light emitting diode (OLED) display device comprising:
    an organic light emitting diode (OLED) formed on a substrate;
    a first inorganic thin layer disposed on the OLED;
    a second inorganic thin layer disposed on the first inorganic thin layer, the second inorganic thin layer including a carbon-doped silicon oxide (SiOC) or a carbon-doped hydrogenated silicon oxide (SiOCH); and
    a third inorganic thin layer disposed on the second inorganic thin layer,
    wherein the second inorganic thin layer has a double-layer structure including a first layer and a second layer, the first layer having a higher content of carbon than the second layer.

2. The OLED display device of claim 1, wherein a thickness of the second inorganic thin layer is 1 μm to 10 μm.

3. The OLED display device of claim 1, wherein the first layer of the second inorganic thin layer is formed to 70% or less of a total thickness of the second inorganic thin layer, and the second layer of the second inorganic thin layer is formed to 30% or more of a total thickness of the second inorganic thin layer.

4. The OLED display device of claim 1, further comprising a buffer layer formed on the substrate to protect the OLED.

5. The OLED display device of claim 4, wherein the buffer layer includes one of $SiO_2$ and SiNx.

6. A method of manufacturing an organic light emitting diode (OLED) display device, the method comprising:
    forming an organic light emitting diode (OLED) on a substrate;
    forming a first inorganic thin layer on the OLED;
    forming a second inorganic thin layer on the first inorganic thin layer; and
    forming a third inorganic thin layer on the second inorganic thin layer,
    wherein the second inorganic thin layer has a double-layer structure including a first layer and a second layer, the first layer having a higher content of carbon than the second layer, and
    wherein the first, second, and third inorganic thin layers are formed by a deposition process.

7. The method of claim 6, wherein the forming of the second inorganic thin layer comprises depositing a layer, which is formed by causing a chemical reaction of a polymer monomer, on the first inorganic thin layer.

8. The method of claim 7, wherein,
    the polymer monomer comprises one of HMDSO, TMDSO, TMMOS$(CH_3)_3SiOCH_3$, BTMSM, TEOS, DVTMDSO[$(CH_3)_2ViSi$-0-$SiVi(CH_3)_2$], and OMCATS, and
    the polymer monomer is chemically reacted with one of $O_2$ and $H_2$.

9. The method of claim 6, wherein the forming of the second inorganic thin layer comprises forming the second inorganic thin layer on the first inorganic thin layer to have a thickness of 1 μm to 10 μm.

10. The method of claim 6, further comprising, after the second inorganic thin layer is formed, curing the second inorganic thin layer.

11. The method of claim 6, wherein,
    the forming of the second inorganic thin layer comprises:
    forming the first layer of the second inorganic thin layer on the first inorganic thin layer; and
    forming the second layer of the second inorganic thin layer on the first layer.

12. The method of claim 11, wherein the first layer of the second inorganic thin layer is formed to have a thickness of 70% or less of a total thickness of the second inorganic thin layer.

13. The method of claim 11, wherein the second layer of the second inorganic thin layer is formed to have a thickness of 30% or more of a total thickness of the second inorganic thin layer.

14. The method of claim 6, wherein,
    the first layer is formed to have a carbon content of 30% to 50%, and
    the second layer is formed to have a carbon content of 0% to 30%.

15. The method of claim 6, wherein the second inorganic thin layer is formed by causing a chemical reaction of a polymer monomer through a CVD process or a PECVD process.

16. The method of claim 6, further comprising forming a buffer layer on the substrate to protect the OLED.

17. The method of claim 16, wherein the buffer layer includes one of $SiO_2$ and SiNx.

18. The method of claim 6, wherein the second inorganic thin layer includes a carbon-doped silicon oxide (SiOC) or a carbon-doped hydrogenated silicon oxide (SiOCH).

\* \* \* \* \*